(12) United States Patent
Do et al.

(10) Patent No.: US 8,110,913 B2
(45) Date of Patent: Feb. 7, 2012

(54) INTEGRATED CIRCUIT PACKAGE SYSTEM WITH INTEGRAL INNER LEAD AND PADDLE

(75) Inventors: Byung Tai Do, Singapore (SG); Linda Pei Ee Chua, Singapore (SG); Zheng Zheng, Singapore (SG); Lee Sun Lim, Singapore (SG)

(73) Assignee: Stats Chippac Ltd., Singapore (SG)

( * ) Notice: Subject to any disclaimer, the term of this patent is extended or adjusted under 35 U.S.C. 154(b) by 407 days.

(21) Appl. No.: 12/144,931

(22) Filed: Jun. 24, 2008

(65) Prior Publication Data

US 2009/0001531 A1    Jan. 1, 2009

Related U.S. Application Data

(60) Provisional application No. 60/947,368, filed on Jun. 29, 2007.

(51) Int. Cl.
*H01L 23/52* (2006.01)
*H01L 21/44* (2006.01)

(52) U.S. Cl. ........ 257/692; 257/669; 257/670; 257/672; 257/695; 257/696; 438/123; 438/124

(58) Field of Classification Search ............. 257/666, 257/669, 670, 672, 674, 692, 695, 696, E23.031, 257/E23.032, E23.043, E23.045, E23.047, E23.07; 438/123, 124
See application file for complete search history.

(56) References Cited

U.S. PATENT DOCUMENTS

| | | | |
|---|---|---|---|
| 5,969,411 A | 10/1999 | Fukaya | |
| 6,265,762 B1 | 7/2001 | Tanaka et al. | |
| 6,329,223 B2 * | 12/2001 | Yu | 438/123 |
| 6,427,976 B1 | 8/2002 | Huang et al. | |
| 6,791,166 B1 | 9/2004 | Foster | |
| 6,909,179 B2 | 6/2005 | Tanaka et al. | |
| 2002/0189835 A1 * | 12/2002 | Miyaki et al. | 174/52.1 |

FOREIGN PATENT DOCUMENTS

JP     07094657 A  *  4/1995

* cited by examiner

*Primary Examiner* — Matthew E Warren
(74) *Attorney, Agent, or Firm* — Mikio Ishimaru

(57) ABSTRACT

An integrated circuit package system includes: fabricating a lead frame including: providing inner leads having an inner lead pitch of progressive length, forming a lead shoulder, on the inner leads, having a shoulder height of a progressive height, and forming outer leads coupled to the lead shoulder and the inner leads; mounting an integrated circuit die on the lead frame; and molding a package body on the lead frame and the integrated circuit die.

20 Claims, 3 Drawing Sheets

INTEGRATED CIRCUIT PACKAGE SYSTEM WITH INTEGRAL INNER LEAD AND PADDLE

CROSS-REFERENCE TO RELATED APPLICATION

This application claims the benefit of U.S. Provisional Patent Application Ser. No. 60/947,368 filed Jun. 29, 2007, and the subject matter thereof is hereby incorporated herein by reference thereto.

TECHNICAL FIELD

The present invention relates generally to integrated circuit packaging, and more particularly to a system for packaging an integrated circuit using a lead frame.

BACKGROUND ART

Today's consumer electronics provide many packaging challenges. The increased functions packaged within cell phones, portable computers, digital cameras, personal video players, and personal data assistants (PDA's) must be robust, inexpensive, and manufactured in very large volumes. Any deficiency in the design or manufacturing processes will quickly ruin the success of any new device. The semiconductor devices used in these products must be able to provide high manufacturing yield while producing millions of units per month.

In the production of the semiconductor devices, such as large scale integration (LSI), more complicated circuits are being fabricated and the number and type of functions are also increasing with improvement in the degree of integration. Because of the ability to provide increased functions, the semiconductor device has come to require more external terminals, and thus, the numbers of pad electrodes provided on a semiconductor chip and the number of leads that form the external terminals of a semiconductor device have increased in a corresponding manner. For example, the number of external terminals has reached the hundreds in a logic semiconductor device. An example of such a multi-lead semiconductor device is a quad flat package (QFP) type semiconductor device. Since a number of leads are provided on all four sides of a package body for sealing a semiconductor chip in the QFP type semiconductor device. Such a device is suitable for forming multi-leads in that the total spacing around the semiconductor device can be utilized effectively when the semiconductor device is packaged on a product substrate, such as a printed circuit board (PCB).

Any deficiencies in the components that are assembled on the product substrate will quickly make themselves known when high volume manufacturing is essential to a products success. Failed devices caused by internally shorted leads, open or cracked leads, or leads that can move within the package body are devastating in high volume manufacturing.

Further, since the number of elements formed on a semiconductor chip has been increased and since these elements are operated at a higher speed, the generation of heat from the semiconductor chip has also increased. A semiconductor device in which heat radiation performance has been improved for the purpose of coping with this problem may use a heat spreader. In this semiconductor device, the heat radiation performance of the semiconductor device is improved by installing a heat spreader on a semiconductor chip. Without a heat spreader, a high percentage of the heat developed in the semiconductor chip must be transferred through the package itself to the product substrate. This transfer of heat may further stress the design integrity of the semiconductor device and its member components. Any manufacturing flaws or cracks in the leads of the semiconductor device may cause a manufacturing failure or early life failure.

Thus, a need still remains for an integrated circuit system with integral inner lead and paddle that can improve manufacturing yields and reduce the cost of manufacture. In view of the industry demand for less expensive and more reliable semiconductor devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: fabricating a lead frame includes: providing inner leads having an inner lead pitch of progressive length, forming a lead shoulder, on the inner leads, having a shoulder height of a progressive height, and forming outer leads coupled to the lead shoulder and the inner leads; mounting an integrated circuit die on the lead frame; and molding a package body on the lead frame and the integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
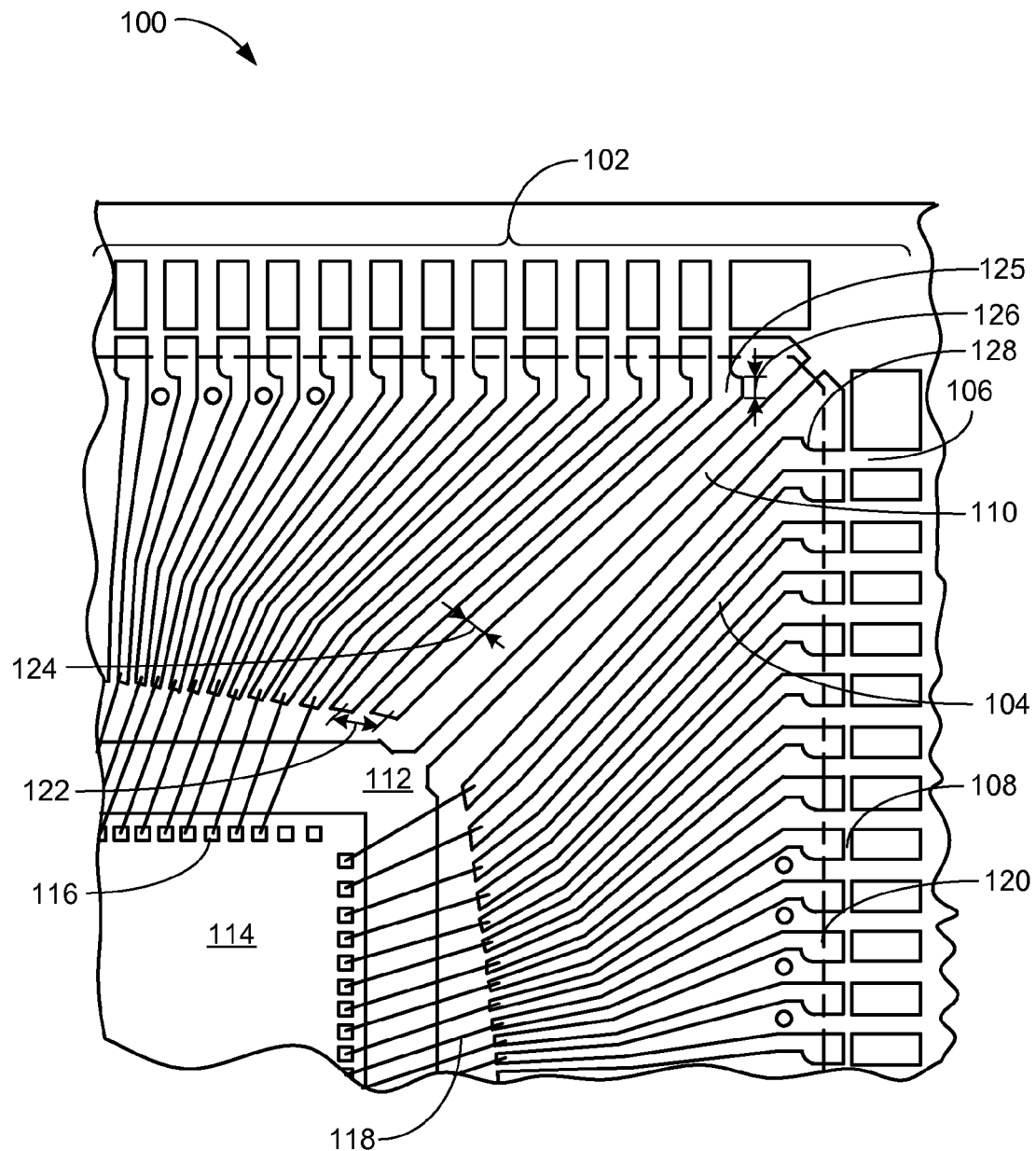
FIG. 1 is a plan view of a corner section of an integrated circuit package system with integral inner lead and paddle, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a plan view of a corner section of an integrated circuit package system 100 with integral inner lead and paddle, in an embodiment of the present invention. The plan view of the corner section of the integrated circuit package system 100 depicts a lead frame 102 having an inner lead 104, an outer lead 106, a dam bar 108, a tie bar 110, and a die attach paddle 112. The lead frame 102 may be formed by punching or etching a thin sheet of conductive material, such as aluminum (Al), iron (Fe), tin (Sn), nickel (Ni), copper (Cu), or an alloy thereof.

An integrated circuit die 114 may be mounted on the die attach paddle 112. The integrated circuit die may have a number of interface pads 116 that are electrically connected to the inner leads 104 by electrical interconnects 118, such as bond wires. During the manufacturing process, the position of the electrical interconnects 118 may be critical. If they are positioned too closely to each other, they may become inadvertently connected forming a short circuit. The electrical interconnects 118 are typically formed in a loop between the interface pads 116 and the inner leads 104. When a package body 120 is formed on the lead frame 102, the pressure from the heated molding compound may cause the loop of the electrical interconnects 118 to deform. This issue is known as wire running. If not properly addressed, wire running may also cause a short circuit.

In order to address the issues that may cause short circuits, the lead frame 102 may progressively increase an inner lead pitch 122, such as the spacing between the centerlines of the ends of the inner leads 104. By progressively increasing the inner lead pitch 122, starting from the middle of a side and incrementally increasing the pitch between the inner leads 104 toward the tie bar 110, additional space may be provided between the electrical interconnects 118. The additional space may prevent short circuits due to positioning the electrical interconnects 118 and wire running. As the inner lead pitch 122 is increased, so is an inner lead width 124. The increase in the inner lead width 124 may provide a protection from handling damage that is a prevalent issue in prior art lead frames.

It has been discovered that the increase in the inner lead width 124 may also remove the need for holding the ends of the inner leads 104 in position by an adhesive, such as lead lock tape, during lead frame fabrication and assembly. This represents a simplification in the assembly process and may result in manufacturing yield improvements due to less handling steps of the lead frame 102.

Another common problem in integrated circuit packages is warping of the package body 120 due to thermal stresses in manufacturing and assembly. This issue may be addressed by the increase in the inner lead width 124 and by providing the inner lead 104 with a lead shoulder 125 having progressive increases in a shoulder height 126, such as a shoulder extent, lengthwise from an end of the inner lead 104 to a radius 128, such as a radial portion of the lead frame 102. The shoulder height 126 is shown in FIG. 1, as measured along an edge of the inner leads defined by a line between a corner of the lead shoulder 125 and an end of the radius 128, such as a curved edge of the inner leads. As with the inner lead width 124, the shoulder height 126 may increase as the inner leads 104 progress from the middle of a side to the corners of the lead frame 102. The combination of the increase in the inner lead width 124 and by a progressive increase in the shoulder height 126 may provide sufficient metal mass to reduce or eliminate the warping problem.

It is also common for the union of the inner lead 104 and the outer lead 106 to form cracks during the manufacturing process. In prior art lead frames, the lead shoulder 125 may end with a right angle between the area of the lead shoulder 125 and the outer lead 106. The present invention provides the radius 128, such as the radial portion of the lead frame 102, between the area of the lead shoulder 125 and the outer lead 106. The radius 128 may distribute the pressure on the outer lead 106 across the area of the lead shoulder 125. The distribution of the pressure across the area of the lead shoulder 125 and the shoulder height 126 may reduce the occurrence of cracks in the outer lead 106.

It has been discovered that the radius 128 in the area of the lead shoulder 125 may prevent the cracking of the outer lead 106 during the manufacturing process. This may increase manufacturing yields and reduce the cost of manufacturing by preventing scrap loss due to cracks in the outer lead 106.

The geometry shown in FIG. 1 is an example only and the actual implementation may have hundreds of the inner leads 104 that must be connected to the interface pads 116 by the electrical interconnects 118. As the package size shrinks and the number of the interface pads 116 increases the position and spacing of the electrical interconnect 118 becomes critical to the manufacturing yield.

Figure 2:
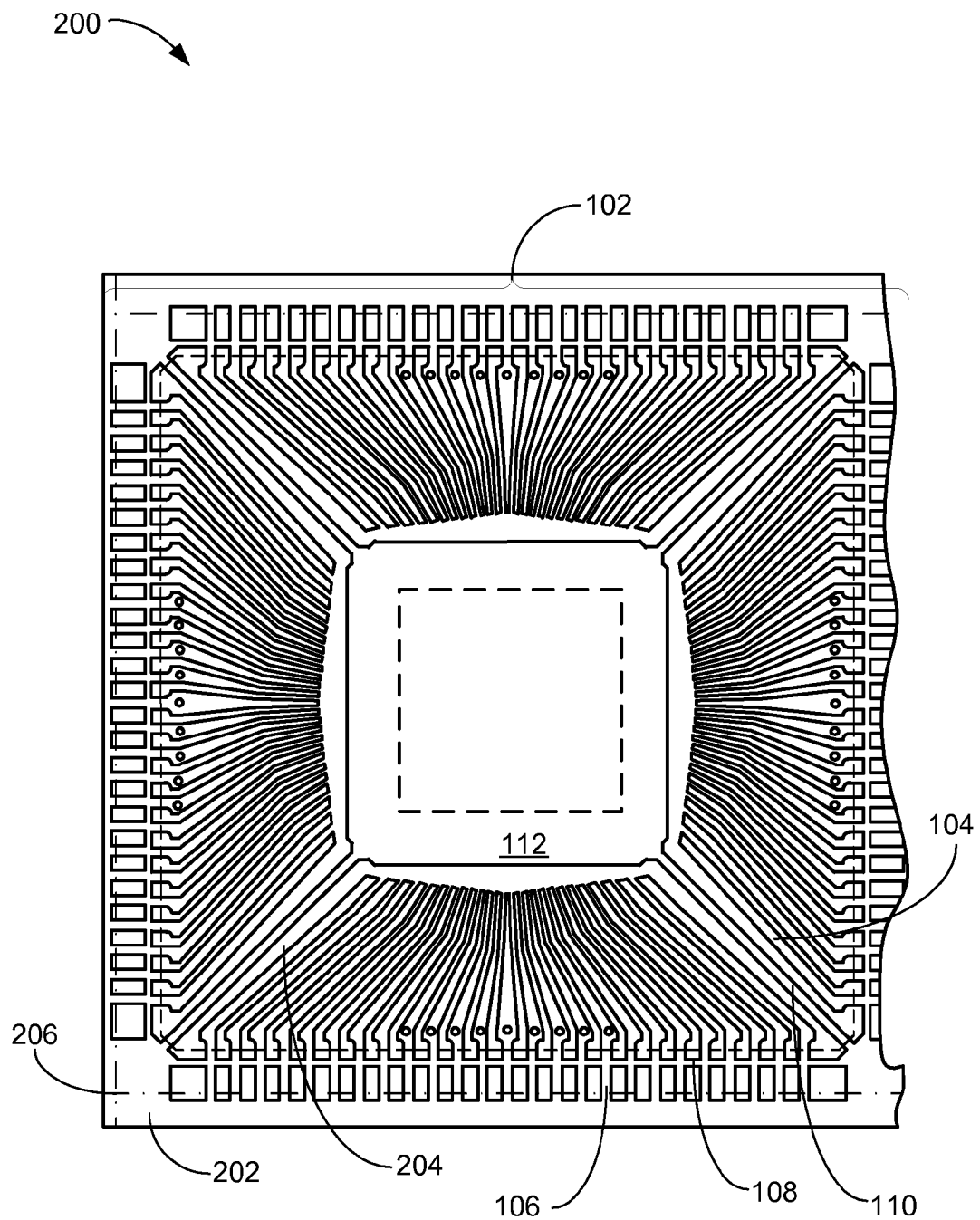
FIG. 2 is a plan view of a lead frame strip segment in an assembly phase of manufacturing.

Referring now to FIG. 2, therein is shown a plan view of a lead frame strip segment 200 in an assembly phase of manufacturing. The plan view of the lead frame strip segment 200 depicts the lead frame 102 having been punched or etched from a strip 202 of the thin conductive material. An opening 204 may be patterned around the inner leads 104, the outer leads 106, the dam bar 108, the tie bar 110, and the die attach paddle 112.

The strip 202 may have several of the lead frame 102. It is tooled to support assembly of more than one of the integrated circuit package systems 100 of FIG. 1 at the same time. During the manufacturing process, the integrated circuit die 114 of FIG. 1 may be mounted on the die attach paddle 112 and coupled to the inner leads 104 by the electrical interconnects 118 of FIG. 1. The package body 120 of FIG. 1 may be molded on the lead frame 102, the integrated circuit die 114, and the electrical interconnects 118.

A singulation line 206 may indicate the area of the strip 202 that will be removed after the package body 120 has been formed. The dam bar 108 may be removed by a shear or punch process as the outer leads 106 are prepared for final shaping. In prior art designs, this process could cause cracks to form in the outer lead 106 where it joins the inner lead. The present invention may prevent these cracks by distributing the forces through the radius 128, of FIG. 1, to the lead shoulder 125, of FIG. 1, which can dissipate the forces due to the increased surface area provided by the shoulder height 126, of FIG. 1.

The lead frame 102 depicted in FIG. 2 is an example only. The actual lead frame may have a different number of the inner leads 104 and the outer leads 106. The die attach paddle 112 may be of a different size or shape and may be connected to the tie bars 110 at a different location.

Figure 3:
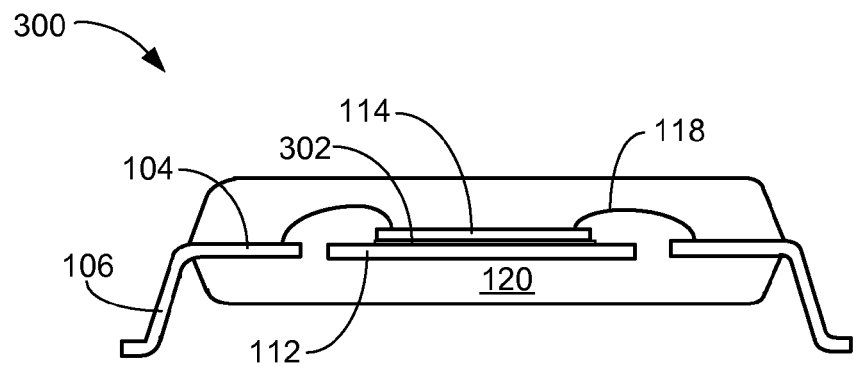
FIG. 3 is a cross-sectional view of an integrated circuit package system.

Referring now to FIG. 3, therein is shown a cross-sectional view of an integrated circuit package system 300. The cross-sectional view of the integrated circuit package system 300 depicts the integrated circuit die 114 mounted on the die attach paddle 112 by an adhesive 302. The electrical interconnects 118 may couple the integrated circuit die 114 to the inner lead 104. The package body 120, such as an epoxy molding compound, may be formed on the die attach paddle 112, the integrated circuit die 114, the adhesive 302, and the electrical interconnects 118.

The outer lead 106 may be formed in many configurations. The shape of the outer leads 106 in FIG. 3 is an example only and other configurations are possible.

Figure 4:
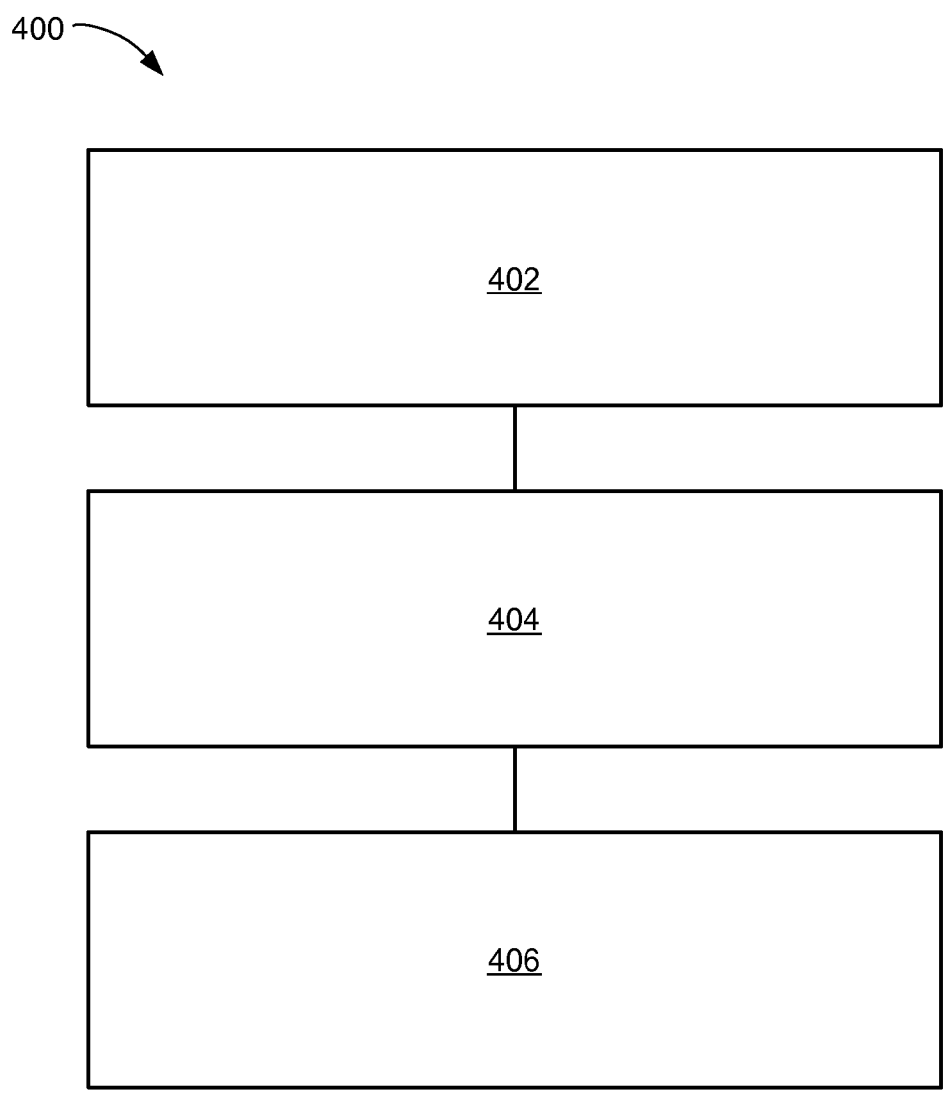
FIG. 4 is a flow chart of an integrated circuit package system for manufacturing the integrated circuit package system with integral inner lead and paddle, in an embodiment of the present invention.

Referring now to FIG. 4, therein is shown a flow chart of an integrated circuit package system 400 for manufacturing the integrated circuit package system with integral inner lead and paddle in an embodiment of the present invention. The system 400 includes fabricating a lead frame including: providing inner leads having an inner lead pitch of progressive length, forming a lead shoulder, on the inner leads, having a shoulder height of a progressive height, and forming outer leads coupled to the lead shoulder and the inner leads in a block 402; mounting an integrated circuit die on the lead frame in a block 404; and molding a package body on the lead frame and the integrated circuit die in a block 406.

It has been discovered that the present invention thus has numerous aspects.

An aspect that has been unexpectedly discovered is that the present invention may provide improved manufacturing yields while reducing handling costs by utilizing the radius and the shoulder height for preventing cracks that could otherwise form in the outer leads.

Another aspect is due to the additional thickness of the inner leads near the corners of the lead frame, lead frame fabrication and assembly may be performed without immobilizing the inner leads by an adhesive. By removing the requirement for the adhesive as an intermediate manufacturing step, the cost of manufacture may be reduced.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for manufacturing semiconductor devices with reduced manufacturing cost and improved line yield. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   fabricating a lead frame includes:
      providing inner leads having progressively increasing inner lead pitches between the inner leads which are adjacent to each other,
      forming a lead shoulder of the inner leads, the lead shoulder having a progressively increasing shoulder extent measured along an edge of the inner leads defined by a line between a corner of the lead shoulders and an end of a curved edge of the inner leads, and
      forming outer leads coupled to the lead shoulder and the inner leads;
   mounting an integrated circuit die on the lead frame; and
   molding a package body on the lead frame and the integrated circuit die.

2. The system as claimed in claim 1 further comprising forming a radial portion of the inner leads between the outer leads and the lead shoulder for preventing cracks in the outer leads.

3. The system as claimed in claim 1 further comprising providing an interface pad on the integrated circuit die.

4. The system as claimed in claim 1 further comprising coupling an electrical interconnect between the integrated circuit die and the inner leads.

5. The system as claimed in claim 1 further comprising forming a tie bar on the lead frame for supporting a die attach paddle.

6. An integrated circuit package system comprising:
   fabricating a lead frame includes:
      providing inner leads having progressively increasing inner lead pitches between the inner leads which are adjacent to each other including providing an inner lead width of progressive width,
      forming a lead shoulder of the inner leads, the lead shoulder having a progressively increasing shoulder extent measured along an edge of the inner leads defined by a line between a corner of the lead shoulders and an end of a curved edge of the inner leads, and
      forming outer leads coupled to the lead shoulder and the inner leads, and
      forming a die attach paddle surrounded by the inner leads;
   mounting an integrated circuit die on the lead frame including applying an adhesive between the integrated circuit die and the die attach paddle; and
   molding a package body on the lead frame and the integrated circuit die including encasing the die attach paddle.

7. The system as claimed in claim 6 further comprising forming the radial portion of the inner leads between the outer leads and the lead shoulder for preventing cracks in the outer leads by distributing a force from the outer leads through the lead shoulder having the shoulder extent.

8. The system as claimed in claim 6 further comprising providing an interface pad on the integrated circuit die for coupling an electrical interconnect between the interface contact and the inner leads.

9. The system as claimed in claim 6 wherein fabricating the lead frame includes etching or punching a sheet of conductive material including aluminum (Al), iron (Fe), tin (Sn), nickel (Ni), copper (Cu), or an alloy thereof.

10. The system as claimed in claim 6 wherein forming the die attach paddle on the lead frame includes coupling a tie bar between the die attach paddle and the lead frame.

11. An integrated circuit package system comprising:
a lead frame includes:
  inner leads having progressively increasing inner lead pitches between the inner leads which are adjacent to each other,
  a lead shoulder of the inner leads, the lead shoulder having a progressively increasing shoulder extent measured along an edge of the inner leads defined by a line between a corner of the lead shoulders and an end of a curved edge of the inner leads, and
  outer leads coupled to the lead shoulder and the inner leads;
an integrated circuit die mounted on the lead frame; and
a package body molded on the lead frame and the integrated circuit die.

12. The system as claimed in claim 11 further comprising a radial portion of the lead frame between the outer leads and the lead shoulder for preventing cracks in the outer leads.

13. The system as claimed in claim 11 further comprising an interface pad on the integrated circuit die.

14. The system as claimed in claim 11 further comprising an electrical interconnect between the integrated circuit die and the inner leads.

15. The system as claimed in claim 11 further comprising a tie bar on the lead frame coupled to a die attach paddle.

16. The system as claimed in claim 11 further comprising:
the lead frame includes:
  an inner lead width of a progressive width, and
  a die attach paddle surrounded by the inner leads; and
an adhesive between the integrated circuit die and the die attach paddle includes the die attach paddle encased by the package body.

17. The system as claimed in claim 16 further comprising a radial portion of the lead frame between the outer leads and the lead shoulder for preventing cracks in the outer leads by a force distributed from the outer leads through the lead shoulder having the shoulder extent.

18. The system as claimed in claim 16 further comprising an interface pad on the integrated circuit die includes an electrical interconnect between the interface contact and the inner leads.

19. The system as claimed in claim 16 wherein fabricating the lead frame from a sheet of conductive material includes aluminum (Al), iron (Fe), tin (Sn), nickel (Ni), copper (Cu), or an alloy thereof etched or punched.

20. The system as claimed in claim 16 wherein the die attach paddle on the lead frame includes a tie bar between the die attach paddle and the lead frame.

* * * * *